United States Patent
Chu et al.

(10) Patent No.: US 10,374,006 B1
(45) Date of Patent: Aug. 6, 2019

(54) MAGNETIC RANDOM ACCESS MEMORY CELL STRUCTURE

(71) Applicant: UNITED MICROELECTRONICS CORP., Hsin-Chu (TW)

(72) Inventors: Chung-Liang Chu, Kaohsiung (TW); Yu-Ping Wang, Taoyuan (TW); Yu-Ruei Chen, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/055,174

(22) Filed: Aug. 6, 2018

(30) Foreign Application Priority Data

Jul. 19, 2018 (CN) .......................... 2018 1 0794914

(51) Int. Cl.
*H01L 27/22* (2006.01)
*G11C 11/16* (2006.01)

(52) U.S. Cl.
CPC .......... *H01L 27/228* (2013.01); *G11C 11/161* (2013.01); *G11C 11/1655* (2013.01); *G11C 11/1657* (2013.01); *G11C 11/1673* (2013.01)

(58) Field of Classification Search
CPC . H01L 27/228; G11C 11/161; G11C 11/1655; G11C 11/1657; G11C 11/1673
See application file for complete search history.

(56) References Cited

U.S. PATENT DOCUMENTS

| | | | | |
|---|---|---|---|---|
| 2005/0254289 A1* | 11/2005 | Nakajima | ............... | B82Y 10/00 365/158 |
| 2011/0122674 A1* | 5/2011 | Lin | .......................... | G11C 11/16 365/145 |
| 2015/0021725 A1* | 1/2015 | Hsu | ......................... | H01L 43/08 257/421 |
| 2016/0111642 A1* | 4/2016 | Perniola | ................. | G11C 11/005 257/2 |
| 2017/0053688 A1* | 2/2017 | Seo | ...................... | G11C 11/1675 |
| 2017/0053965 A1* | 2/2017 | Baek | ...................... | H01L 27/228 |
| 2017/0263850 A1* | 9/2017 | Ito | .......................... | H01L 27/228 |

\* cited by examiner

*Primary Examiner* — Sitaramarao S Yechuri
(74) *Attorney, Agent, or Firm* — Winston Hsu

(57) ABSTRACT

The present invention provides a magnetic random access memory (MRAM) structure, the MRAM structure includes a transistor including a gate, a source and a drain, and a magnetic tunnel junction (MTJ) device, the MTJ device includes at least one free layer, an insulating layer and a fixed layer, the insulating layer is disposed between the free layer and the fixed layer, and the free layer is located above the insulating layer. The free layer of the MTJ device is electrically connected to a bit line (BL). The fixed layer of the MTJ device is electrically connected to the source of the transistor, and the drain of the transistor is electrically connected to a sense line (SL). And a first conductive via, directly contacting the MTJ device, the material of the first conductive via comprises tungsten.

17 Claims, 4 Drawing Sheets

MAGNETIC RANDOM ACCESS MEMORY CELL STRUCTURE

BACKGROUND OF THE INVENTION

1. Field of the Invention

The invention relates to the field of semiconductor technology, in particular to a magnetic tunnel junction (MTJ) structure of a magnetic random access memory (MRAM).

2. Description of the Prior Art

MRAM is a nonvolatile memory technology that uses magnetization to represent stored data. Generally, MRAM includes a plurality of magnetic cells in an array. Each cell typically represents one bit of data. Included in the cells are magnetic elements. A magnetic element may include two ferromagnetic "plates" (or layers upon a semiconductor substrate) each of which has a magnetization direction (or orientation of magnetic moments) associated with it. The two ferromagnetic plates are separated by a thin non-magnetic layer.

More specifically, a MRAM element is often based on a magnetic tunnel junction (MTJ) device. An MTJ device includes at least three basic layers: a "free layer," a tunneling barrier layer, and a "fixed layer." The free layer and the fixed layer are ferromagnetic layers. The tunneling barrier layer is a thin insulator layer located between the free layer and the fixed layer. The magnetization direction of the free layer is free to rotate, but is constrained by the physical size of the layer to point in either of two directions; the magnetization of the fixed layer is fixed in a particular direction. A bit is written to the MTJ device by orienting the magnetization direction of the free layer in one of the two directions. Depending upon the orientations of the magnetic moments of the free layer and the fixed layer, the resistance of the MTJ device will change. Thus, the bit may be read by determining the resistance of the MTJ device. When the magnetization direction of the free layer and the fixed layer are parallel and the magnetic moments have the same polarity, the resistance of the MTJ device is low. Typically, this is designated a "0." When the magnetization direction of the free layer and the fixed layer are anti-parallel and the magnetic moments have the opposite polarity, the resistance of the MTJ is high. Typically, this is designated a "1."

SUMMARY OF THE INVENTION

The present invention provides a magnetic random access memory (MRAM) cell structure, the MRAM cell structure includes a transistor, comprising a gate, a source and a drain, a magnetic tunnel junction (MTJ) device, the MTJ device comprises at least one free layer, an insulating layer and a fixed layer, wherein the insulating layer is disposed between the free layer and the fixed layer, and the free layer is located above the insulating layer, wherein the free layer of the MTJ device is electrically connected to a bit line (BL), the fixed layer of the MTJ device is electrically connected to the source of the transistor, and the drain of the transistor is electrically connected to a sense line (SL), and a first conductive via, directly contacting the MTJ device, wherein the material of the first conductive via comprises tungsten.

The present invention further provides a magnetic random access memory (MRAM) cell structure, the MRAM cell structure includes a transistor, comprising a gate, a source and a drain, a magnetic tunnel junction (MTJ) device, the MTJ device comprises at least one free layer, an insulating layer and a fixed layer, wherein the insulating layer is disposed between the free layer and the fixed layer, and the free layer is located above the insulating layer, wherein the free layer of the MTJ device is electrically connected to the drain of the transistor, the fixed layer of the MTJ device is electrically connected to a bit line, and the source of the transistor is electrically connected to a sense line (SL), and a first conductive via, directly contacting the MTJ device, wherein the material of the first conductive via comprises tungsten.

The invention is characterized in that the MTJ device and the conductive via directly contacting the MTJ device have a special cross-sectional profile. The conductive via has an upper wide and lower narrow profile and is made of tungsten, so that the MTJ device can be effectively carried, and the issue of copper atom diffusion during writing the value 1 to the MTJ device can be avoided. In addition, the MTJ device has a trapezoidal and parabolic profile, so in actual production, it has the advantages of easy process and stable structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
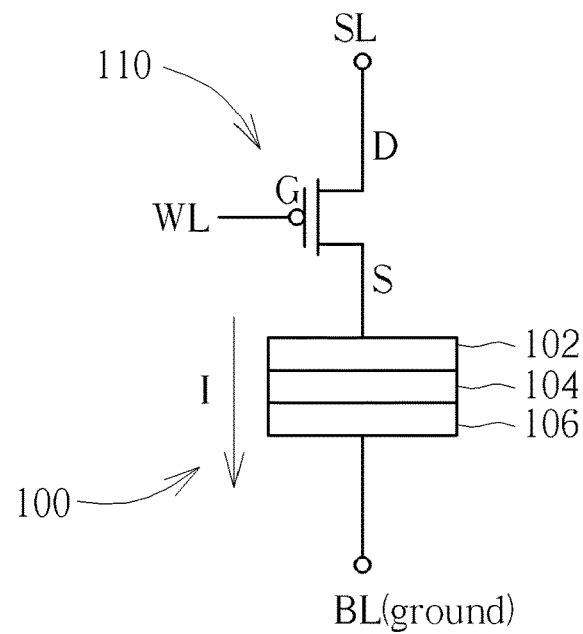
FIG. 1 is a schematic circuit diagram of a magnetic random access memory (MRAM) cell.

Please refer to FIG. 1, which illustrates a circuit diagram of a magnetic random access memory (MRAM) cell. The MRAM cell includes a magnetic memory device, such as a magnetic tunnel junction (MTJ) device 100 and a switching element 110. The switching element 110 includes, for example, a metal oxide semiconductor (MOS) transistor, a MOS diode, and/or a bipolar transistor, including a gate G, a drain D, and a source S. The switching element 110 is used to read the MTJ device 100, or be used to write (data) into to the MTJ device 100.

The MTJ device 100 includes at least a fixed layer 102, an insulating layer 104, and a free layer 106. The magnetization direction of the free layer 106 may be free to rotate point one or two directions, and may be switched by the spin-torque transfer (STT). For the fixed layer 102, an anti-ferromagnetic layer can be used to fix the magnetization direction in a specific direction. The insulating layer 104 is sandwiched between the free layer 106 and fixed layer 102.

In this embodiment, the free layer 106 is connected to a bit line (BL) to provide voltage during the writing or the reading process. The gate of switching element 110 is coupled to a word line (WL), to activate the MRAM cell during the writing or the reading process. The source S of the switching element 110 is connected to the fixed layer 102, and the drain D of the switching element 110 is connected to a sense line (SL). During the writing or the reading process, when the memory cell is activated by the word line (WL), the fixed layer 102 is driven by the voltage.

The data stored in the MTJ device 100 can may be expressed with the magnetization direction of the fixed layer 102 respects the free layer 106. When the magnetization directions of the free layer 106 and the fixed layer 102 are parallel, and the magnetic moments have the same polarity, the resistance of the MTJ device 100 is low. Basically, this is designated a "0." When the magnetization directions of the free layer 106 the fixed layer 102 are anti-parallel, and the magnetic moments have the opposite polarity, the resistance of the MTJ device 100 is high. Basically, this is designated a "1."

In another embodiment of the invention, the MTJ device 100 is coupled to the switching element 110 in different way. Please refer to FIG. 2, which illustrates a circuit diagram of a cell of another magnetic random access memory of the present invention. In the present embodiment, the MTJ device 100 also includes a fixed layer 102, an insulating layer 104, and a free layer 106. The switching element 110 also includes a gate G, a drain D, and a source S. However, in the present embodiment, the source S of the switching element 110 is connected to the sense line SL, the drain D of the switching element 110 is connected to the free layer 106, and the gate G of the switching element 110 is connected to the word line WL, the fixed layer 102 of the MTJ device 100 is connected to the bit line BL.

Figure 2:
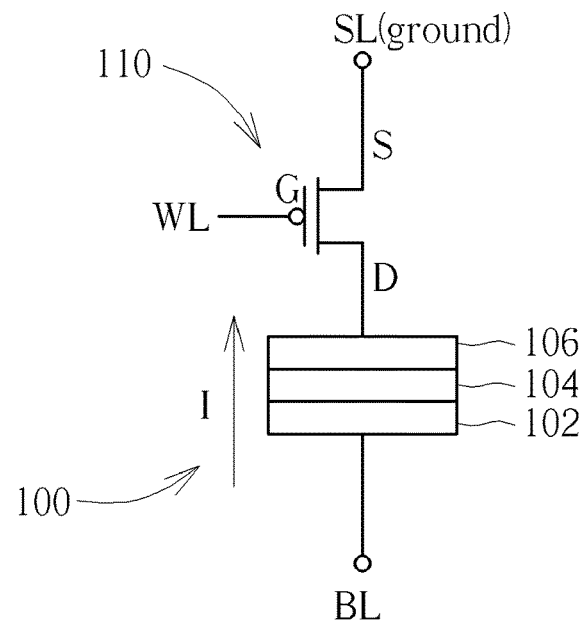
FIG. 2 is a schematic circuit diagram of another magnetic random access memory (MRAM) cell.

Regardless of the connection method shown in FIG. 1 or FIG. 2 above, the operation of the MRAM can be ensured. However, according to some prior art content, for example, US patent publication no. US 2011/0122674, different connections of the MTJ device and the switching element will affect the writing/reading speed of the MTJ device. One phenomenon of the MTJ device is that when the value "1" is written to the MTJ device (that is, the internally stored value is converted from 0 to 1), it takes more current than the value is written as "0" to the MTJ device (that is, the internal storage is converted from 1 to 0). This phenomenon is due to the internal magnetic moment conversion performance of the MTJ device and the high internal resistance. The detailed description of this phenomenon has been disclosed in the prior art (for example, the above-mentioned U.S. Patent publication no. US 2011/0122674), so no further description is made here. In addition, when writing the value "1" to the MTJ device, the current will flow from the fixed layer to the free layer of the MTJ device, as shown in the current direction I in FIG. 1 or FIG. 2. Besides, the reason of the current flowing from the fixed layer to the free layer of the MTJ device is related to the spin-torque transfer (STT), which belongs to the known technology, and it is not described here.

Applicant found that under higher current operation, some issues may occur in MTJ device. For example, if a conductive via connected to an MTJ device is made of copper (Cu), in a high-intensity current state, the copper atoms in the conductive via may diffuse into the MTJ device, which affects the quality of the MTJ device.

Figure 3:
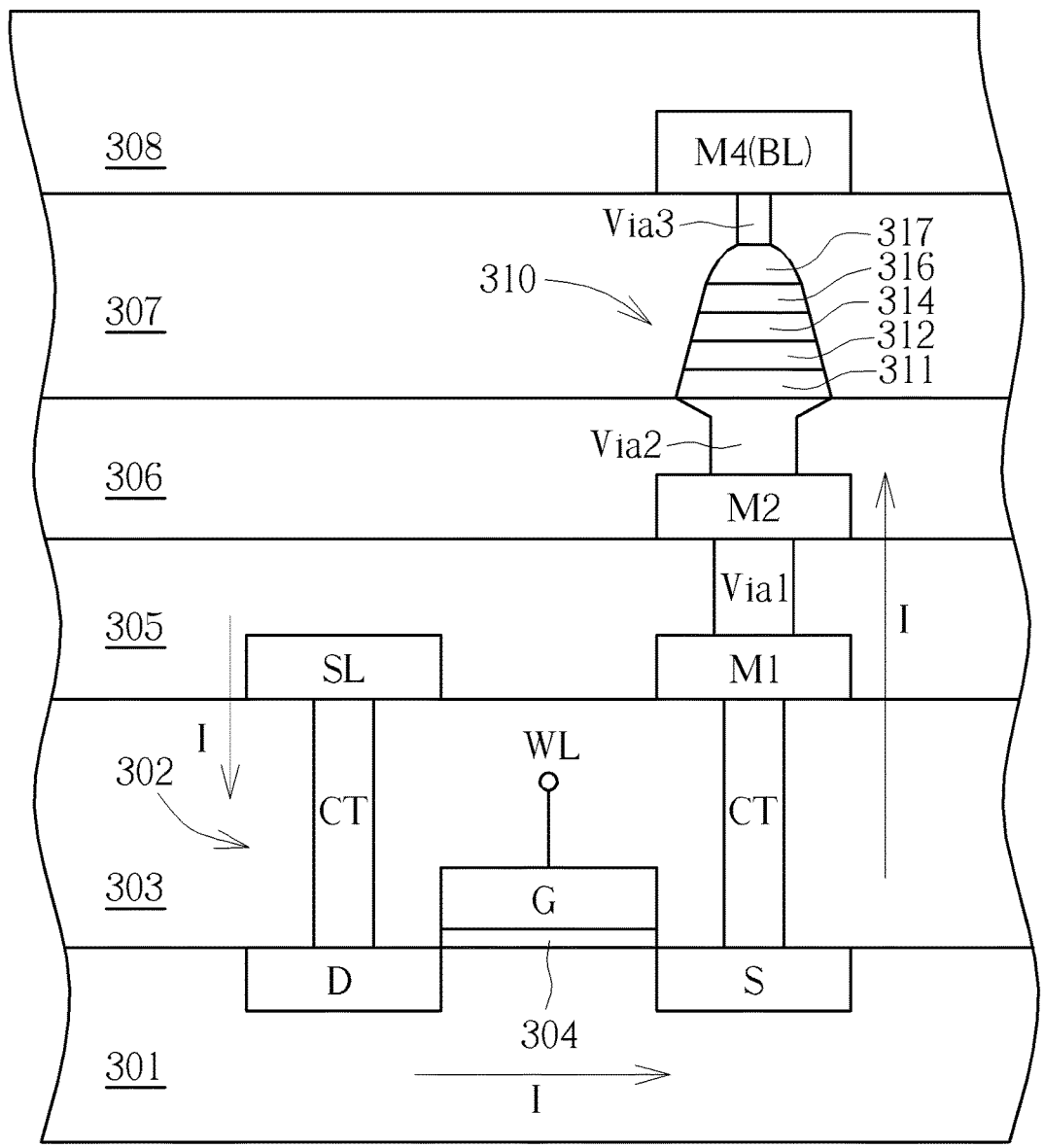
FIG. 3 is a cross-sectional structural view showing a cell of a magnetic random access memory according to a preferred embodiment of the present invention.

Please refer to FIG. 3, which is a cross-sectional structural diagram of a cell of a magnetic random access memory according to a preferred embodiment of the present invention. The cross-sectional structure shown in FIG. 3 corresponds to the circuit diagram shown in FIG. 1. In this embodiment, the cell includes a substrate 301, and a transistor 302 is formed on the substrate 301 and disposed in a dielectric layer 303. The transistor 302 is located in an active area (AA) of the substrate 301, and the transistor 302 includes a gate. G, a gate insulating layer 304, a source S and a drain D. The dielectric layer 303 further includes other dielectric layers 305, 306, 307, and 308 stacked on the dielectric layer 303. In addition, the drain D is electrically connected to a sense line SL through a contact structure CT, the word line WL is electrically connected to the gate G, and the source S is electrically connected to the magnetic tunneling junction (MTJ) device 310. In addition, another contact structure CT, a metal layer M1, a conductive via Via1, a metal layer M2, and a conductive via Via2 are sequentially included between the source S and the MTJ device 310. The MTJ device 310 further includes a fixed layer 312, an insulating layer 314 and a free layer 316. Besides, the MTJ device 310 further includes a lower electrode 311 and an upper electrode 317, and the lower electrode 311 is located below the fixed layer 312 and directly contacting the fixed layer 312, the upper electrode 317 is located above the free layer 316 and directly contacting the free layer 316, and the material of the lower electrode 311 or the upper electrode 317 is, for example, tantalum (Ta), but is not limited thereto. The upper electrode 317 of the MTJ device 310 is electrically connected to the metal layer M4 disposed above through the conductive via Via3, the metal layer M4 is electrically connected to the bit line BL, and the lower electrode 311 of the MTJ device 310 is electrically connected to the metal layer M2 disposed below through the conductive via Via2. The metal layers M1, M2, and the like described herein represent metal conductive layers located in different dielectric layers. For example, the metal layer M1 and the conductive via Via1 are located in the same dielectric layer 305, while the metal layer M2 is located in the dielectric layer 306 on the upper layer.

Figure 4:
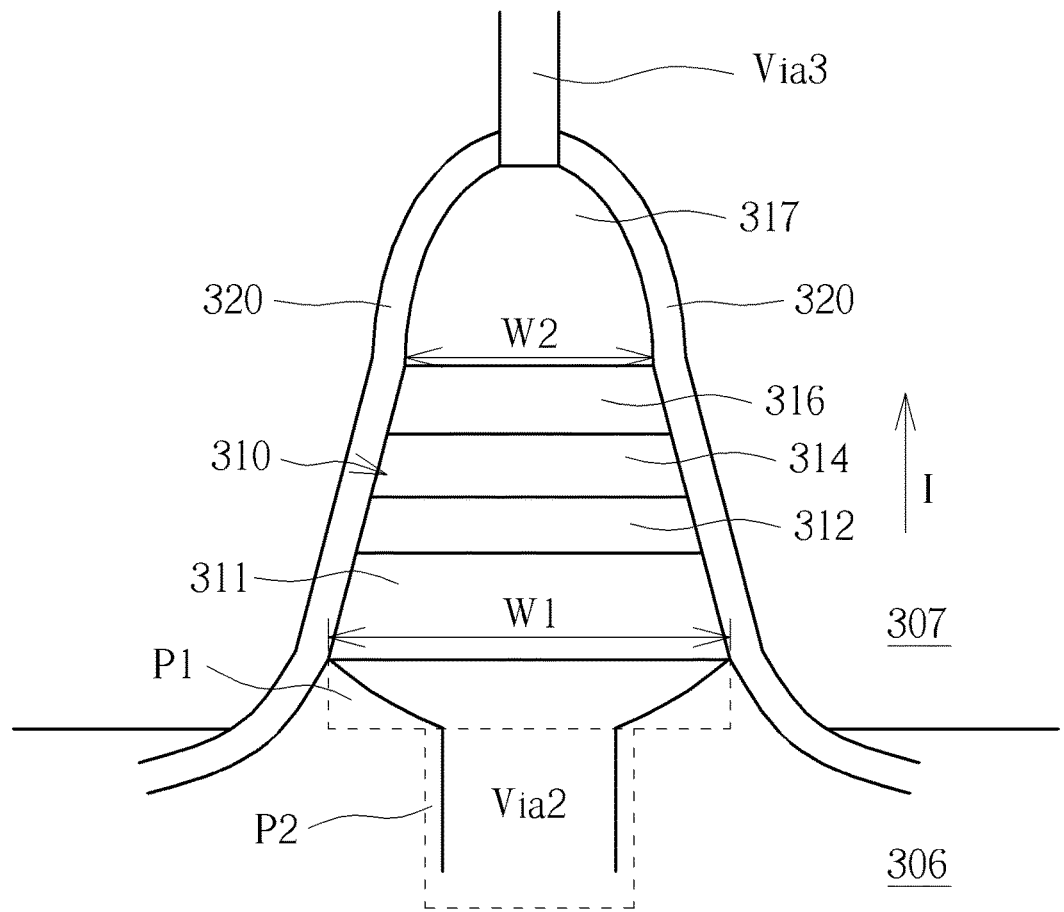
FIG. 4 is a partially enlarged view showing the MTJ device and the surrounding elements in FIG. 3.

FIG. 4 is a partially enlarged view showing the MTJ device 310 and the surrounding elements in FIG. 3. As shown in FIG. 4, the conductive via Via2, the lower electrodes 311, the fixed layer 312, the insulating layer 314, the free layer 316, the upper electrode 317, and the conductive via Via3 are sequentially included from bottom to top. One of the features of the present invention is that the shape of the MTJ structure and the adjacent conductive via. As described above, when the value 1 is written to the MTJ device, the generated current intensity is large, and the current flows from the fixed layer 312 to the free layer 316 (from bottom to top, as shown in FIG. 3 and FIG. 4), the larger current I may cause copper atoms in the conductive via made of copper to diffuse into the MTJ device 310, thereby affecting the quality of the MTJ device 310. Therefore, in order to avoid the above issue, in the present invention, the conductive via Via2 located under the MTJ device and directly contacting the MTJ device is not made of copper, but is made of tungsten (W), and the tungsten material can avoid the above copper atom diffusion issue. It is worth noting that all the conductive vias (such as Via1, Via3) can be made of copper except for the conductive via Via2 located under and directly contacting with the MTJ device to reduce material cost and enhance conductivity. Preferably, the metal layers M1 and M2 and the conductive vias Via1 and Via3 in the present embodiment are made of copper. Therefore, the conductive via Via2 made of tungsten are located in two conductive vias Via1 and Via3 made of copper. And the conductive via Via1 is located above the contact structure CT.

From the cross-sectional view, the shape of the conductive via Via 2 of the present invention is not a simple cylindrical shape, but has an upper wider and lower narrow profile. In more detail, the conductive via Via 2 of the present invention can be divided into two parts: a first portion P1 is located above a second portion P2, the first portion P1 preferably has an inverted trapezoidal cross-sectional profile, and the second portion P2 has a cylindrical or rectangular profile. In this way, the first portion P1 has a large width and can completely carry the upper MTJ device, and the second portion P2 has a narrow width, which is advantageous for aligning the underlying metal layer (for example, M2). In this embodiment, the width W1 of the first portion P1 of the conductive via Via2 is preferably equal to the width of the bottom surface of the lower electrode 311, and preferably the width W1 is the widest portion of the overall MTJ device. In the actual manufacturing process, the conductive via Via2 can be formed by etching the dielectric layer multiple times and then filling the conductive material.

In addition, the MTJ device 310 of the present invention (including the lower electrode 311, the fixed layer 312, the insulating layer 314, the free layer 316, and the upper electrode 317) also has a special shape cross sectional profile, and is not a stacked structure having the same area. As shown in FIG. 4, the areas of the lower electrode 311, the fixed layer 312, the insulating layer 314, and the free layer 316 are sequentially decreased from bottom to top, that is, the four-layer structures each have a trapezoidal cross-sectional profile. The four-layer structure may also be combined to form a structure having a trapezoidal profile. As for the upper electrode 317, there is a contour similar to a bullet shape, a parabola shape or a semi-oval shape, which is located above the free layer 316, and the bottom surface width W2 of the upper electrode 317 is preferably equal to the top surface width of the free layer 316. In addition, a spacer 320 covers the outside of the MTJ device 310, and the conductive via Via3 penetrates through the spacer 320 and is in direct contact with the upper electrode 317. The material of the spacer 320 is, for example, tantalum nitride, but is not limited thereto. The above structure has the advantages of easy fabrication and stable structure, and can avoid the above problem of diffusing copper atoms to the MTJ device when writing the value 1 to the MTJ device, and improving the overall MRAM yield.

Figure 5:
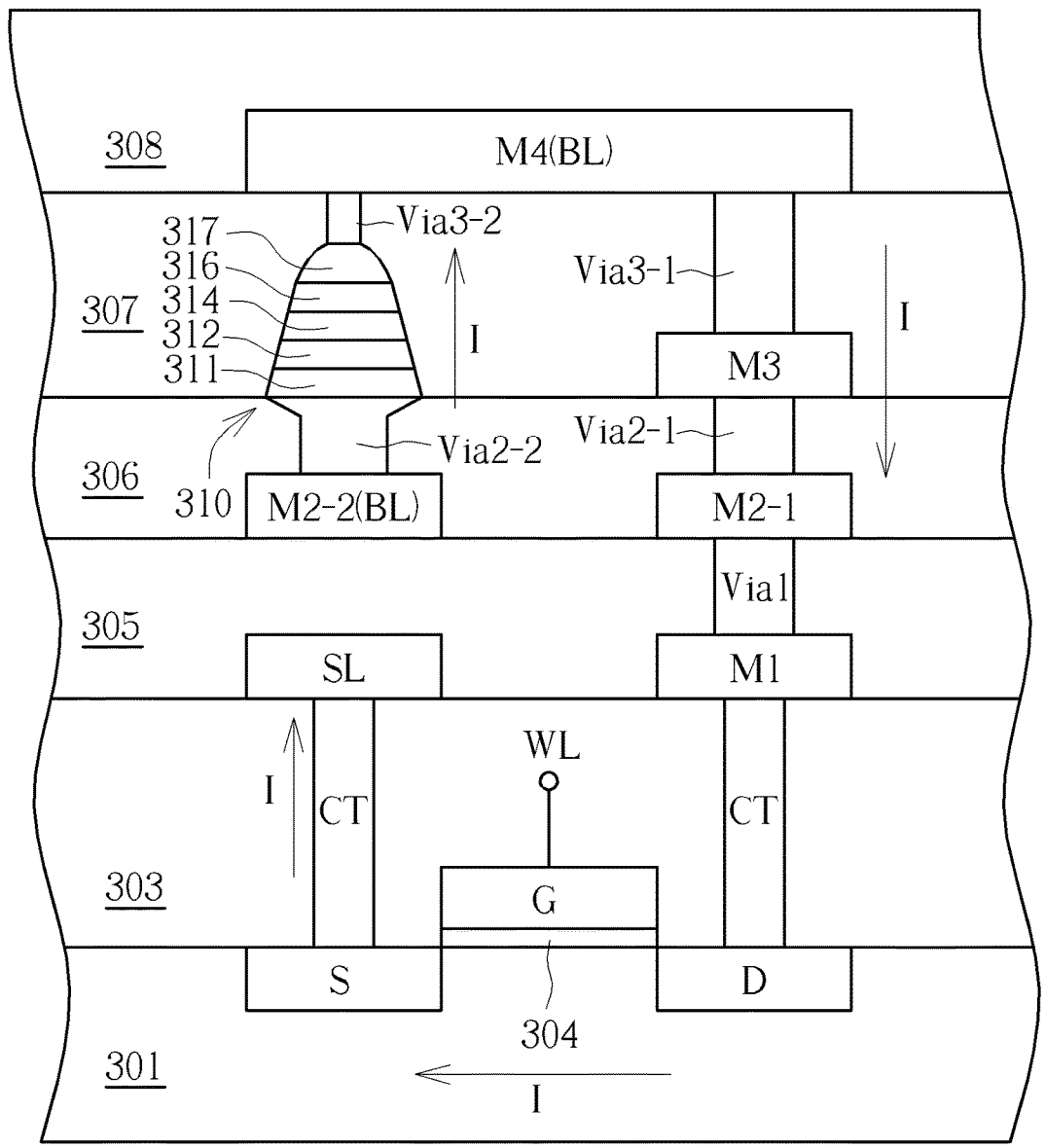
FIG. 5 is a cross-sectional structural view showing a magnetic random access memory cell according to another preferred embodiment of the present invention.

FIG. 3 is a schematic cross-sectional view showing the cell of the magnetic random access memory based on the circuit diagram shown in FIG. 1. In another embodiment of the present invention, as shown in FIG. 5, a schematic cross-sectional view of a cell of the magnetic random access memory based on the circuit diagram shown in FIG. 2 is shown. This embodiment also includes a transistor and a MTJ device, but the connection between the transistor and the MTJ device is different from that of the embodiment shown in FIG. 3. It should be noted that the transistor in this embodiment is "reverse connected" with the MTJ device. Specifically, the transistor 302 in this embodiment includes a gate G, a gate insulating layer 304, a source S, and a drain D. The source S is electrically connected to a sense line SL through a contact structure CT. The gate G is electrically connected to the word line WL, and the drain D is electrically connected to the MTJ device 310. In the cross-sectional view, the MTJ device 310 is not located right above the drain D, but the MTJ device 310 is electrically connected to the upper metal layer M4 through the conductive via Via3-2, and the metal layer M4 is then electrically connected to the drain D through the conductive via Via3-1, the metal layer M3, the conductive via Via2-1, the metal layer M2-1, the conductive via Via1, the metal layer M1, and the contact structure CT. The MTJ device 310 is electrically connected to the underlying metal layer M2-2 through the conductive via Via2-2, and the metal layer M2-2 is electrically connected to the bit line BL. The metal layer M2-1, the metal layer M2-2, the conductive via Via2-1 and the conductive via Via2-2 are located in the same dielectric layer 306, and the metal layer M3 and the MTJ device 310 are disposed in a same dielectric layer 307. In other words, a bottom surface of the MTJ device 310 in this embodiment is aligned with a bottom surface of the metal layer M3 in a horizontal surface (as shown in the top surface of the dielectric layer 306 shown in FIG. 5). Except for the above features, other features, material characteristics, and reference numerals of the remaining components are similar to those of the above-described first preferred embodiment, and therefore will not be described again.

Similar to the above embodiment, the MTJ device 310 of the present embodiment includes the lower electrode 311, the fixed layer 312, the insulating layer 314, the free layer 316, and the upper electrode 317 from bottom to top. The conductive via Via2-2 directly contacts the lower electrode 311, and the conductive via 3-2 directly contacts the upper electrode 317. In the present embodiment, when the value 1 is written to the MTJ device 310, the current flows from the bit line BL, passing through the MTJ device, and finally to the sense line SL. In other words, the current flows from the fixed layer 312 to the free layer 316 of the MTJ device 310. Therefore, in order to avoid the issue mentioned above that the copper atoms are diffused to the MTJ device, the conductive via Via2-2 in this embodiment is also made of tungsten, and do not contain copper. Furthermore, other detailed features of the MTJ device, for example, a conductive via Via 2-2 having an upper wider and a lower narrower profile, a lower electrode 311, a fixed layer 312, an insulating layer 314 and a free layer 316 having a trapezoidal profile, and the electrodes 317 having a top parabolic profile and the like are the same as those shown in the above-mentioned FIG. 4, and will not be further described herein.

It is to be noted that the circuit connection or the memory structure of the present invention is exemplified by FIGS. 1, 2, 3, and 5, but the present invention is not limited thereto. An MRAM structure having the same or similar MTJ structure as shown in FIG. 4, or the combining in other circuit connections, should also within the scope of the present invention.

In summary, the invention is characterized in that the MTJ device and the conductive via directly contacting the MTJ device have a special cross-sectional profile. The conductive via has an upper wide and lower narrow profile and is made of tungsten, so that the MTJ device can be effectively carried, and the issue of copper atom diffusion during writing the value 1 to the MTJ device can be avoided. In addition, the MTJ device has a trapezoidal and parabolic profile, so in actual production, it has the advantages of easy process and stable structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic random access memory (MRAM) cell structure, comprising:
    a transistor, comprising a gate, a source and a drain;
    a magnetic tunnel junction (MTJ) device, the MTJ device comprises at least one free layer, an insulating layer and a fixed layer, wherein the insulating layer is disposed between the free layer and the fixed layer, and the free layer is located above the insulating layer, wherein the free layer of the MTJ device is electrically connected to a bit line (BL), the fixed layer of the MTJ device is electrically connected to the source of the transistor, and the drain of the transistor is electrically connected to a sense line (SL), wherein the MTJ device further comprises an upper electrode located at a topmost layer of the MTJ device, and wherein the upper electrode has a semi-oval profile; and
    a first conductive via, directly contacting the MTJ device, wherein the material of the first conductive via comprises tungsten.

2. The magnetic random access memory cell structure of claim 1, wherein the MTJ device has a trapezoidal profile.

3. The magnetic random access memory cell structure of claim 1, wherein the MTJ device further includes a lower electrode located at a bottommost layer of the MTJ device, and wherein the lower electrode has a trapezoidal profile.

4. The magnetic random access memory cell structure of claim 3, wherein the first conductive via directly contacts the lower electrode.

5. The magnetic random access memory cell structure of claim 3, further comprising a second conductive via directly contacting the upper electrode.

6. The magnetic random access memory cell structure of claim 5, wherein the material of the second conductive via comprises copper.

7. The magnetic random access memory cell structure of claim 5, further comprising a spacer covering the upper electrode, the MTJ device, and the lower electrode, wherein the second conductive via penetrates through a portion of the spacer.

8. The magnetic random access memory cell structure of claim 1, wherein the first conductive via comprises a first portion and a second portion, wherein the first portion is disposed on the second portion, the first portion has an inverted trapezoidal profile, and the second portion has a rectangular profile.

9. A magnetic random access memory (MRAM) cell structure, comprising:
    a transistor, comprising a gate, a source and a drain;
    a magnetic tunnel junction (MTJ) device, the MTJ device comprises at least one free layer, an insulating layer and a fixed layer, wherein the insulating layer is disposed between the free layer and the fixed layer, and the free layer is located above the insulating layer, wherein the free layer of the MTJ device is electrically connected to the drain of the transistor, the fixed layer of the MTJ device is electrically connected to a bit line, and the source of the transistor is electrically connected to a sense line (SL), wherein the MTJ device further comprises an upper electrode located at a topmost layer of the MTJ device, and wherein the upper electrode has a semi-oval profile; and
    a first conductive via, directly contacting the MTJ device, wherein the material of the first conductive via comprises tungsten.

10. The magnetic random access memory cell structure of claim 9, wherein the MTJ device has a trapezoidal profile.

11. The magnetic random access memory cell structure of claim 9, wherein the MTJ device further includes a lower electrode located at a bottommost layer of the MTJ device, and wherein the lower electrode has a trapezoidal profile.

12. The magnetic random access memory cell structure of claim 11, wherein the first conductive via directly contacts the lower electrode.

13. The magnetic random access memory cell structure of claim 11, further comprising a second conductive via directly contacting the upper electrode.

14. The magnetic random access memory cell structure of claim 13, wherein the material of the second conductive via comprises copper.

15. The magnetic random access memory cell structure of claim 13, further comprising a spacer covering the upper electrode, the MTJ device, and the lower electrode, wherein the second conductive via penetrates through a portion of the spacer.

16. The magnetic random access memory cell structure of claim 9, wherein the first conductive via comprises a first portion and a second portion, wherein the first portion is disposed on the second portion, the first portion has an inverted trapezoidal profile, and the second portion has a rectangular profile.

17. The magnetic random access memory cell structure of claim 9, further comprising a second metal layer, wherein a bottom surface of the MTJ device and a bottom surface of the second metal layer are aligned on a horizontal surface.

* * * * *